(12) United States Patent
He et al.

(10) Patent No.: US 11,514,977 B2
(45) Date of Patent: Nov. 29, 2022

(54) MEMORY DEVICES IMPLEMENTING DATA-ACCESS SCHEMES FOR DIGIT LINES PROXIMATE TO EDGES OF COLUMN PLANES, AND RELATED DEVICES, SYSTEMS, AND METHODS

(71) Applicant: Micron Technology, Inc., Boise, ID (US)

(72) Inventors: Yuan He, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/220,110

(22) Filed: Apr. 1, 2021

(65) Prior Publication Data
US 2022/0319581 A1     Oct. 6, 2022

(51) Int. Cl.
| | |
|---|---|
| G11C 29/00 | (2006.01) |
| G11C 11/4094 | (2006.01) |
| G11C 29/44 | (2006.01) |
| G06F 11/10 | (2006.01) |
| G11C 11/408 | (2006.01) |

(52) U.S. Cl.
CPC ...... *G11C 11/4094* (2013.01); *G11C 29/4401* (2013.01); *G11C 29/72* (2013.01); *G11C 29/81* (2013.01); *G06F 11/1048* (2013.01); *G11C 11/4087* (2013.01)

(58) Field of Classification Search
CPC ............ G11C 11/4085; G11C 11/4094; G11C 11/4091; G11C 11/4096; G11C 11/4087; G11C 11/4097; G11C 29/028; G11C 29/024; G11C 29/40; G11C 29/1201
See application file for complete search history.

(56) References Cited

U.S. PATENT DOCUMENTS

| | | | |
|---|---|---|---|
| 4,954,951 A | 9/1990 | Hyatt | |
| 5,163,023 A * | 11/1992 | Ferris | G11C 29/848 365/230.02 |
| 5,999,478 A | 12/1999 | Proebsting | |
| 6,003,148 A * | 12/1999 | Yamauchi | G11C 29/34 365/201 |
| 6,449,210 B1 * | 9/2002 | Manning | G11C 5/025 365/230.06 |
| 6,542,973 B2 | 4/2003 | Hsu et al. | |
| 7,447,956 B2 | 11/2008 | Mamileti et al. | |
| 11,114,181 B1 * | 9/2021 | Wieduwilt | G11C 29/787 |

(Continued)

*Primary Examiner* — Mushfique Siddique
(74) *Attorney, Agent, or Firm* — TraskBritt

(57) ABSTRACT

Memory device data-access schemes are disclosed. Various embodiments may include a memory device including a first column plane, a second column plane, and a data-steering circuit. The first column plane may include a first edge, a second edge, and a first number of digit lines arranged between the first edge and the second edge. The second column plane may include a third edge positioned adjacent to the second edge, a fourth edge, and a second number of digit lines arranged between the third edge and the fourth edge. The data-steering circuit may be configured to logically relate a first digit line of the first number of digit lines to a second digit line of the second number of digit lines, the first digit line proximate to the first edge and the second digit line proximate to the fourth edge. Associated systems and methods are also disclosed.

17 Claims, 9 Drawing Sheets

(56) References Cited

U.S. PATENT DOCUMENTS

| | | | |
|---|---|---|---|
| 2002/0109154 A1* | 8/2002 | Lee | G11C 29/808 257/200 |
| 2002/0167852 A1* | 11/2002 | Cowles | G11C 11/4099 365/201 |
| 2021/0158888 A1* | 5/2021 | Wieduwilt | G11C 29/44 |
| 2021/0217453 A1* | 7/2021 | Ong | G11C 11/161 |
| 2021/0241842 A1* | 8/2021 | Amrie Bin Shaari | G11C 29/802 |

\* cited by examiner

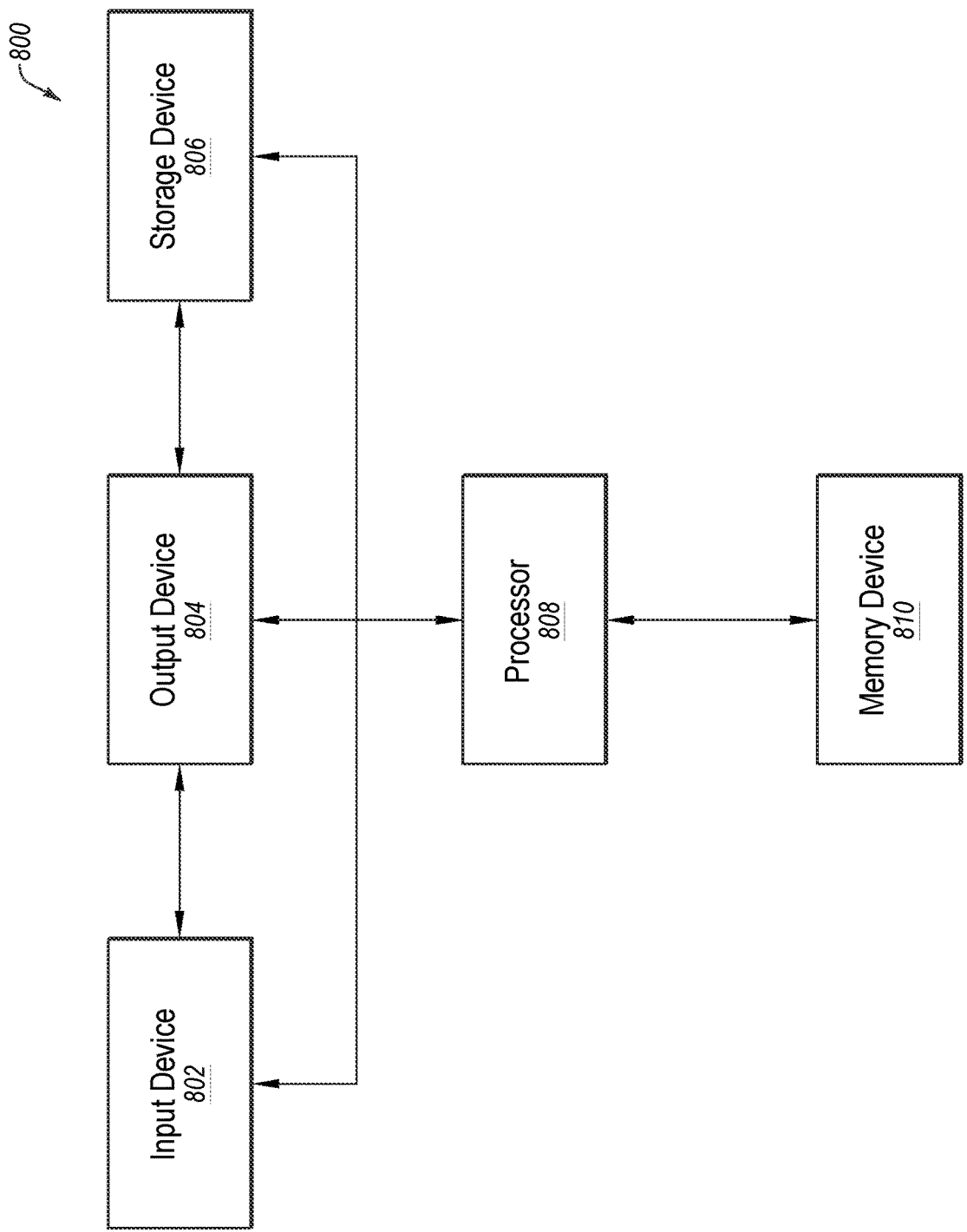

MEMORY DEVICES IMPLEMENTING DATA-ACCESS SCHEMES FOR DIGIT LINES PROXIMATE TO EDGES OF COLUMN PLANES, AND RELATED DEVICES, SYSTEMS, AND METHODS

TECHNICAL FIELD

Embodiments of the disclosure relate to memory devices, and more specifically to memory device data-access schemes. Yet more specifically, various embodiments relate to memory devices implementing data-access schemes for digit lines at edges of column planes, and to related devices, systems, and methods.

BACKGROUND

Memory devices are typically provided as internal, semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), and Flash memory.

A memory device may include a number of memory cells arranged in column planes. Digit lines may be arranged between opposing edges of the column planes to provide access to the memory cells. Digit lines, or memory cells accessible by the digit lines, may fail. Outcomes for a column block in which digit lines, or memory cells accessible by the digit lines, of both column planes exhibit failures, may be less desirable than outcomes for a column block in which digit lines, or memory cells accessible by the digit lines, of one column plane of the column block exhibits failures.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

Each of FIG. 4A

FIG. 8 is a simplified block diagram illustrating an example electronic system, in accordance with at least one embodiment of the present disclosure.

DETAILED DESCRIPTION

Figure 1:
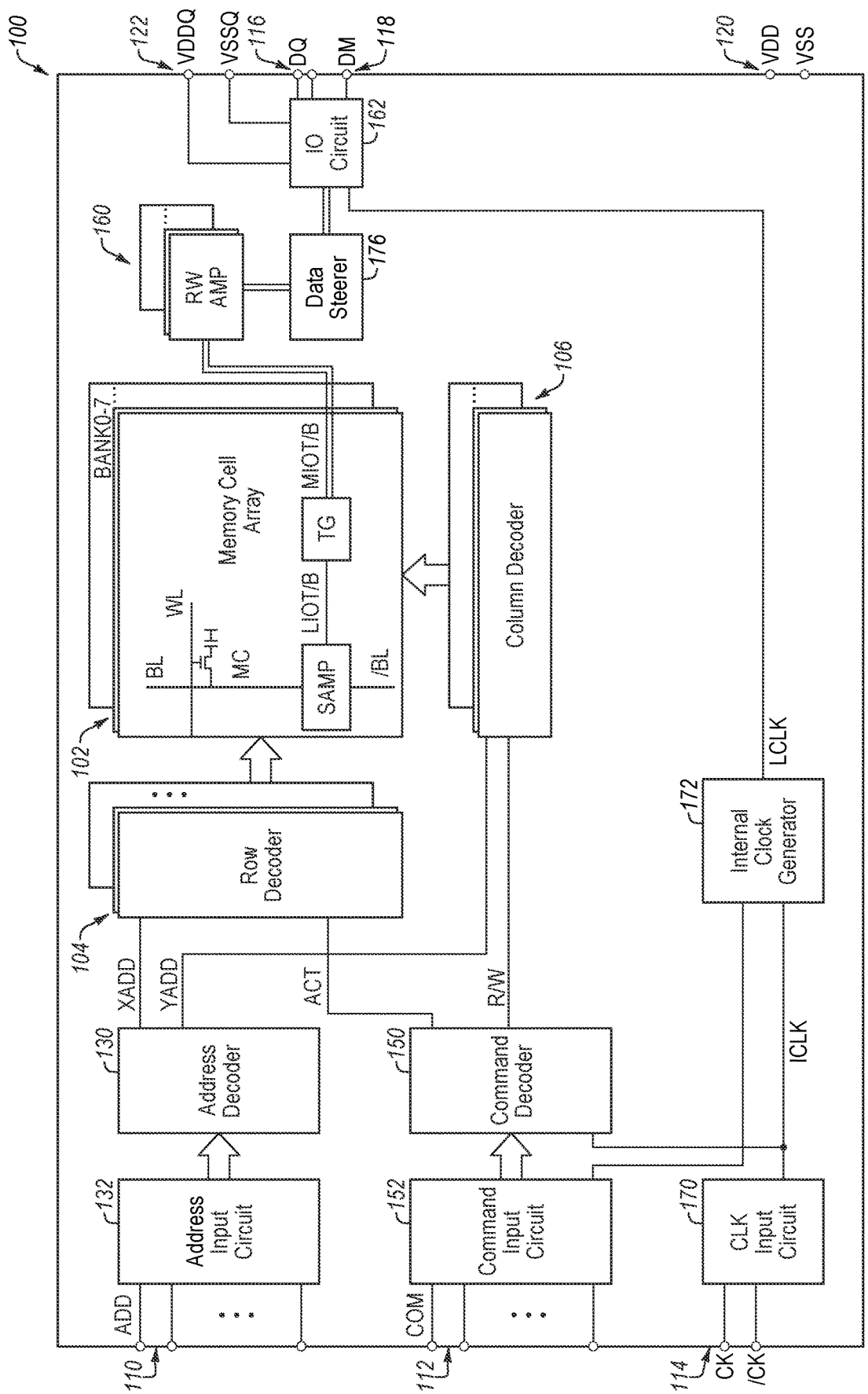
FIG. 1 is a block diagram illustrating an example memory device, in accordance with at least one embodiment of the present disclosure.

A memory device may include a number of column blocks. Each column block may include two column planes arranged adjacent to one another. Each column plane may include a number of memory cells arranged therein. The memory cells may be accessible through word lines and digit lines. In particular, each memory cell may be electrically coupled to one word line and to one digit line (each word line may be electrically coupled to more than one memory cell; likewise, each digit line may be electrically coupled to more than one memory cell). As an example, in a read operation, when a word line is charged, each memory cell to which the word line is electrically coupled may transfer charge (indicative of the digital value stored in the memory cell) to a respective digit line to which the memory cell is also electrically coupled. A data-steering circuit may electrically couple digit lines (e.g., one at a time) to an input/output circuit. The input/output circuit may provide a signal indicative of one or more charges at the memory cells.

Digit lines, or memory cells accessible by the digit lines, may fail. In the present disclosure, references to a digit line "failing" or a "digit line failure" encompass failures of the digit line itself, failures of one or more memory cells accessible by the digit line, and/or failures associated with logic that allows for access to the digit line (e.g., a column-select gate). Digit lines proximate to edges of column planes may be more likely to fail than digit lines farther from the edges of the column planes. For example, if a column block includes 128 digit lines, numbered 0 to 127, arranged in order between edges of the column block, the digit lines 0, 63, 64, and 127, each of which being proximate an edge of an associated column plane, may have the highest probability of failing. In particular, the digit lines numbered 0 and 127 may have a higher probability of failing than other digit lines by virtue of digit lines 0 and 127 being proximate to outer edges of the column planes that comprise the column block. And, the digit lines numbered 63 and 64 may have a higher probability of failing than other digit lines by virtue of digit lines 63 and 64 being proximate to inner edges of the two column planes that comprise the column block.

If both column planes of a column block exhibit failures (a "two-column-plane failure"), outcomes for the column block may be less desirable than outcomes for a column block in which only one column plane exhibits failures (a "one-column-plane failure"). For example, during testing of a memory device, repairs may be implemented to one column plane of a column block. However, if both column planes of a column block exhibit failures, it may be determined that the column block is irreparable.

One or more embodiments of the present disclosure include logically relating digit lines with column planes. The logical relations of the digit lines to column planes may decrease a rate of two-column-plane failures. In particular, one or more embodiments of the present disclosure may include logically relating a digit line of a first column plane to a second column plane and/or logically relating a digit line of the second column plane to the first column plane. As a specific example, in a column block that includes 128 digit lines, numbered 0 to 127, arranged in order between edges of the column block, logically relating digit lines numbered 63 and 64 with one of the column planes and/or logically relating digit lines numbered 0 and 127 with the other of the column planes may decrease a rate of two-column plane failures. One reason for this is because adjacent digit lines may be more likely to fail together than non-adjacent digit lines. Specifically, in this example, a failure of both digit lines 63 and 64 may be more likely than a failure of both digit lines 0 and 63. Thus, by logically relating digit lines 63 and 64 with one of the column planes, in cases where digit lines 63 and 64 fail together (and none of the other digit lines of the other of the column planes fails), what would have been a two-column-plane failure is a one-column-plane failure.

Some memory devices include an input/output (TO) break between column planes of a column block. The IO break may be characterized by absence of a column select (CS). Certain memory devices include a CS gate between column planes of a column block, at what would otherwise be the IO break. Including a CS gate that spans the space between column planes of a column block provides for access to digit lines above memory cells between the column planes of the column block. Thus, the certain memory devices may have additional memory capacity compared with memory devices of the same die size lacking a CS gate between column planes.

Embodiments of the present disclosure are not limited to the certain memory devices (i.e., memory devices including a CS gate between column planes of a column block). However, embodiments of the present disclosure may be implemented in the certain memory devices. One result of implementing the embodiments of the present disclosure in the certain memory devices is that the digit lines associated with the CS gate between the column planes may be logically related to a single column plane. Thus, a failure of the CS gate, or any of the digit lines associated with the CS gate, may be attributable to a single column plane rather than two column planes. Such logical relations may increase the chances of a failure of the CS gate resulting in a one-column-plane failure rather than a two-column-plane failure.

Although various embodiments are described herein with reference to memory devices, the present disclosure is not so limited, and the embodiments may be generally applicable to microelectronic systems and/or semiconductor devices that may or may not include memory devices. Embodiments of the present disclosure will now be explained with reference to the accompanying drawings.

FIG. 1 is a functional block diagram illustrating an example memory device 100, in accordance with at least one embodiment of the present disclosure. Memory device 100 may include, for example, a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random access memory) or a three-dimensional (3D) DRAM. Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each bank may include one or more column blocks. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL (alternatively referred to herein as "digit lines") are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or /BL.

Memory device 100 may be generally configured to be receive various inputs (e.g., from an external controller or host) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, a data steerer 176, an input/output circuit 162, and data terminals 116. Further, in response active command ACT, a write signal, a row address XADD, and a column address YADD, write data may be supplied to memory array 102 via data terminals 116, input/output circuit 162, data steerer 176, read/write amplifiers 160, transfer gate TG, and sense amplifier SAMP. The write data may be written to the memory cell MC specified by row address XADD and column address YADD.

Data steerer 176 may be positioned between read/write amplifiers 160 and input/output circuit 162. Data steerer 176 may be configured to electrically couple digit lines with input/output lines. In particular, data steerer 176 may be configured to electrically couple inputs/outputs of read/write amplifiers 160 (which are electrically coupled to digit lines through MIOT/B, TG, LIOT/B, and SAMP) with inputs/outputs of input/output circuit 162. Data steerer 176 may be configured to select which digit line to electrically couple to each input/output line. For example, in response to a first column-select signal (not illustrated in FIG. 1), data steerer 176 may be configured to electrically couple a first set of one or more digit lines with a number of selected inputs/outputs lines and, in response to a second column-select signal (not illustrated in FIG. 1), data steerer 176 may be configured to electrically couple a second set of one or more digit lines with the number of selected of inputs/outputs lines.

The position of data steerer 176 between read/write amplifiers 160 and input/output circuit 162 is given as an example. Data steerer 176 may be positioned in other locations within memory device 100 and yet may be configured to electrically couple digit lines with input/output lines. For example, data steerer 176 may be positioned between TG and read/write amplifiers 160.

Clock signals CK and/CK may be received via clock terminals 114. A CLK input circuit 170 may generate internal clock signals ICLK based on the clock signals CK and/CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Figure 2:
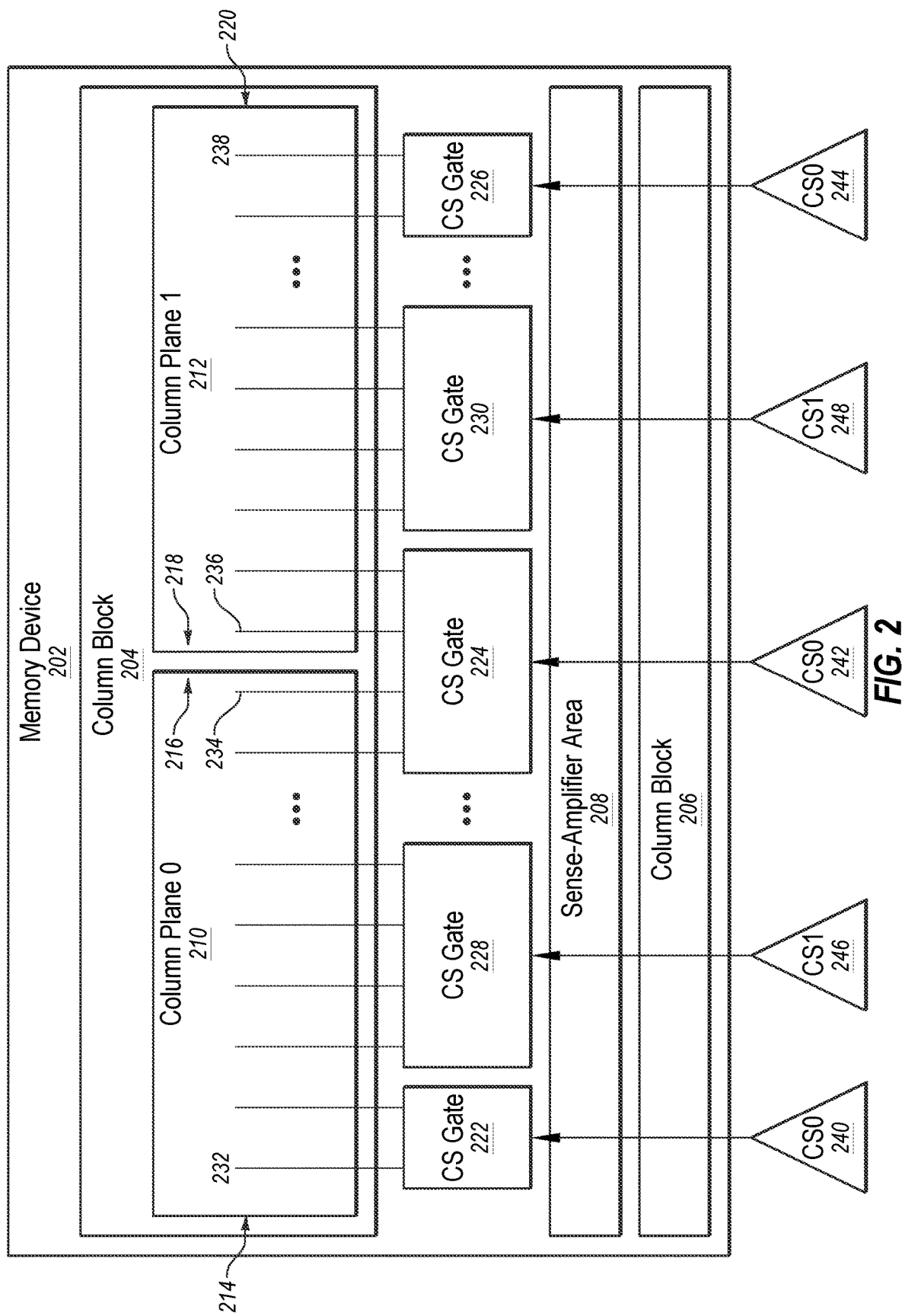
FIG. 2 is a functional block diagram illustrating functional aspects of an example memory device in accordance with at least one embodiment of the present disclosure.

FIG. 2 is a functional block diagram illustrating functional aspects of an example memory device 202 in accordance with at least one embodiment of the present disclosure. In particular, FIG. 2 illustrates how two or more digit lines may be logically related in accordance with at least one embodiment of the present disclosure. Memory device 202 may be an example of memory device 100 and may include all of the elements of memory device 100, though, for simplicity, many of the elements of memory device 100 are not illustrated in FIG. 2.

Memory device 202 includes a column block 204, a column block 206, and a sense-amplifier area 208. Column block 204 may be a block of memory including memory cells of a memory array of memory device 202. Column block 204 includes a first column plane, column plane 0 210 and a second column plane, column plane 1 212. Column block 206 may similarly include two column planes (not illustrated). Column block 204 (or column plane 0 210 and column plane 1 212) may include a number of memory cells (not illustrated in FIG. 2). Column block 204 (or column plane 0 210 and column plane 1 212) may include a number of digit lines configured to provide access to the number of memory cells. For example, when a word line (not illustrated in FIG. 2) is charged, each memory cell to which the word line is electrically coupled may transfer charge to, or receive charge from, a respective digit line to which the respective memory cell is electrically coupled. In FIG. 2, for simplicity, only sixteen digit lines are illustrated, i.e., eight for each of column plane 0 210 and column plane 1 212. There may be any number of digit lines for a column plane.

Memory device 202 includes a CS gate 222, a CS gate 224, a CS gate 226, a CS gate 228, and a CS gate 230 (which may be referred to collectively as CS gates or individually as a CS gate). The CS gates may be configured to selectively electrically couple digit lines to input/output lines (e.g., input/output lines of input/output circuit 162 of FIG. 1). For example, in response to a control signal (e.g., a control signal CS0 240), CS gate 222 may be configured to electrically couple digit lines, to which it is electrically coupled, to input/output lines. The electrically coupling between the digit lines and the input/output lines may include one or more amplifiers or other elements (e.g., one or more sense amplifiers e.g., SA of FIG. 1, which may be arranged in sense-amplifier area 208 and/or one or more read/write amplifiers 160 of FIG. 1).

In FIG. 2, for simplicity, only five CS gates are illustrated. There may be any number of CS gates in memory device 202. Further, in FIG. 2, for simplicity, two digit lines are electrically coupled to each of CS gate 222 and CS gate 226; and four digit lines are electrically coupled to each of CS gate 224, CS gate 228, and CS gate 230. There may be any number of digit lines electrically coupled to any or each of the CS gates. For example, in some embodiments, there may be one, two, four, or eight digit line(s) electrically coupled to any or each of the CS gates. In other embodiments, there may be a relationship between a size of a logical word to be provided at, or received from, an input/output circuit (e.g., input/output circuit 162 of FIG. 1) of the memory device 202 and the number of digit lines electrically coupled to each of the CS gates.

Further, in some embodiments, there may be a relationship between one or more CS gates (and/or a relationship between one or more digit lines accessible by the respective CS gates). For example, CS gate 222, CS gate 224, and CS gate 226 may be related such that they are configured to be accessed at substantially the same time ("substantially simultaneously"). For example, a data-steering circuit, (e.g., data steerer 176 of FIG. 1) may be configured to provide a control signal CS0 240, a control signal CS0 242, and a control signal CS0 244 at substantially the same time to access CS gate 222, CS gate 224, and CS gate 226 at substantially the same time. Additionally, the data-steering circuit may be configured to provide a control signal CS1 246 and a control signal CS1 248 at substantially the same time to access CS gate 228 and CS gate 230 at substantially the same time. In response to receiving control signals, the CS gates may be configured to electrically couple their associated digit lines to input/output lines. For example, in response to receiving control signal CS1 246, CS gate 228 may be configured to electrically couple one or more of its associated digit lines to the input/output lines.

Column block 206 may be similar to column block 204. Column block 206 may be complementary to column block 204. For example, when digit lines of column block 204 are accessed, complementary digit lines (not illustrated) of column block 206 may be accessed.

Sense-amplifier area 208 may include one or more sense amplifiers (e.g., SA of FIG. 1) configured to amplify a charge on digit lines of column block 204 and column block 206. For example, the sense amplifiers of sense-amplifier area 208 may be configured to amplify a difference between a charge found on, or applied to, a digit line of column block 204 and its complement on column block 206. The means of determining which digit lines of column block 206 are accessed may be the same as the means of determining which digit lines of column block 204 are accessed. For example, the CS gates may cause electrical coupling between the digit lines of column block 204, the complementary digit lines of column block 206, and the sense amplifiers of sense-amplifier area 208.

A data-steering circuit (e.g., data steerer 176 of FIG. 1) may be configured to provide one or more control signals to control which of the CS gates activates, i.e., closes to allow charge to transfer to or from its associated digit lines to input/output lines. Additionally or alternatively, the data-steering circuit may control which input/output lines are electrically coupled to each of the CS gates. The data-steering circuit may be configured to receive incoming column-select signals, which may include instructions to electrically couple digit lines to input/output lines. The data-steering circuit may be configured to determine which digit line is electrically coupled to which input/output line in response to an incoming column-select signal.

The data-steering circuit may logically relate digit lines with incoming column-select signals and/or with input/output lines. For example, the data-steering circuit may include logic that logically relates each possible incoming column-select signal with one or more control signals to be provided to the various CS gates. Further, the data-steering circuit may include logic that logically relates each digit line of each CS gate with an input/output line.

For example, the data-steering circuit may receive a first column-select signal and output one or more control signals to certain CS gates to access certain digit lines. Thus, the data-steering circuit may logically relate two or more of the digit lines to each other, i.e., by accessing the two or more digit lines in response to the first column-select signal. Further, the data-steering circuit may determine which input/output lines are electrically coupled to the certain digit lines.

As a specific example, in response to a first column-select signal (e.g., "CS0"), the data-steering circuit may be configured to provide control signals (CS0 240, CS0 242, and CS0 244) to CS gate 222, CS gate 224, and CS gate 226, respectively. Because the digit lines electrically coupled to CS gate 222, CS gate 224, and CS gate 226 are accessed at substantially the same time, e.g., in response to the first column-select signal, they are logically related to each other. Further, the data-steering circuit may determine which input/output lines are electrically coupled to each of the digit lines electrically coupled to CS gate 222, CS gate 224, and CS gate 226. For example, the data-steering circuit may determine to electrically couple the digit lines associated with CS gate 222 and CS gate 226 with input/output lines associated with column plane 0 210 (CP0) and the digit lines associated with CS gate 224 with input/output lines associated with column plane 1 212 (CP1).

The data-steering circuit may be configured to logically relate digit lines that are adjacent to each other, that are not adjacent to one another, that are of the same column plane, and/or that are not of the same column plane. For example, in the prior specific example, the data-steering circuit logically related the two digit lines electrically coupled to CS gate 222 (on column plane 0 210) with the two digit lines electrically coupled to CS gate 226 (on column plane 1 212) and the four digit lines electrically coupled to CS gate 224 (two on column plane 0 210 and two on column plane 1 212) with each other.

In some embodiments, the data-steering circuit may be configured to logically relate one or more digit lines at each of the outer edges of column planes of a column block with each other. As a specific example, column plane 0 210 may include an edge 214 at an outer edge and column plane 1 212 may include an edge 220 at an outer edge of column plane 1 212. A digit line 232 may be proximate to edge 214 and a digit line 238 may be proximate to edge 220. The data-steering circuit may be configured to logically relate digit line 232 with digit line 238. For example, the data-steering circuit may be configured to electrically couple digit line 232 and digit line 238 to respective input/output lines in response to receiving a single column-select signal.

For example, in response to a first column-select signal (e.g., "CS0"), the data-steering circuit may be configured to provide control signal CS0 240 and control signal CS0 244 to activate CS gate 222 and CS gate 226 respectively. Further, the data-steering circuit may be configured to electrically couple CS gate 222 and CS gate 226 to specific input/output lines. For example, the data-steering circuit may be configured to electrically couple digit line 232 to an input/output line associated with column plane 0 210 and, the data-steering circuit may be configured to electrically couple digit line 238 to another input/output line associated with column plane 0 210. In this example, although digit line 238 is on column plane 1 212, digit line 238 is electrically coupled to an input/output line associated with column plane 0 210.

In some embodiments, the data-steering circuit may be configured to logically relate one or more digit lines at each of the inner edges of column planes of a column block with each other. As a specific example, column plane 0 210 may include an edge 216 at an inner edge and column plane 1 212 may include an edge 218 at an inner edge of column plane 1 212. A digit line 234 may be proximate to edge 216 and a digit line 236 may be proximate to edge 218. The data-steering circuit may be configured to logically relate digit line 234 with digit line 236. For example, the data-steering circuit may be configured to electrically couple digit line 234 and digit line 236 to respective input/output lines in response to receiving a single column-select signal.

For example, in response to a first column-select signal (e.g., "CS0"), the data-steering circuit may be configured to provide control signal CS0 242 to activate CS gate 224. Further, the data-steering circuit may be configured to electrically couple CS gate 224 to specific input/output lines. For example, the data-steering circuit may be configured to electrically couple digit line 234 to an input/output line associated with column plane 1 212 and the data-steering circuit may be configured to electrically couple digit line 236 to another input/output line associated with column plane 1 212. In this example, although digit line 234 is on column plane 0 210, digit line 234 is electrically coupled to an input/output line associated with column plane 1 212.

One result of the data-steering circuit providing access to digit lines on one column plane at input/output lines associated with another column plane is that, in some circumstances, failures at digit lines on two column planes may be treated as a one-column-plane failure. As a specific example, if both of digit line 234 and digit line 236 fail, and if digit line 234 and digit line 236 are both configured to (through the data-steering circuit) be electrically coupled to input/output lines associated with a single column plane (e.g., as described in the example above), then, the failures of digit line 234 and digit line 236 may be treated as a one-column-plane failure. Likewise, if both of digit line 232 and digit line 238 fail, and if digit line 232 and digit line 238 are both configured to (through the data-steering circuit) be electrically coupled to input/output lines associated with a single column plane (e.g., as described in the example above), then, the failures of digit line 232 and digit line 238 may be treated as a one-column-plane failure.

In FIG. 2, CS gate 224 is illustrated as a single gate. However, in some memory devices, CS gate 224 may be, or may include, two or more gates, e.g., a first CS gate associated with column plane 0 210 and a second CS gate associated with column plane 1 212.

Additionally, although the examples provided herein are described with relation to an individual digit line (e.g., digit line 232, digit line 234, digit line 236, and digit line 238), the present disclosure is not so limited. For example, in some embodiments, digit lines proximate to edges may include two or more adjacent digit lines proximate to edges. For example, a digit line proximate to digit line 232 and coupled to CS gate 222 may be accessed and/or electrically coupled to an input/output line at substantially the same time as the digit line 232 is accessed and/or electrically coupled to an input/output line.

Figure 3:
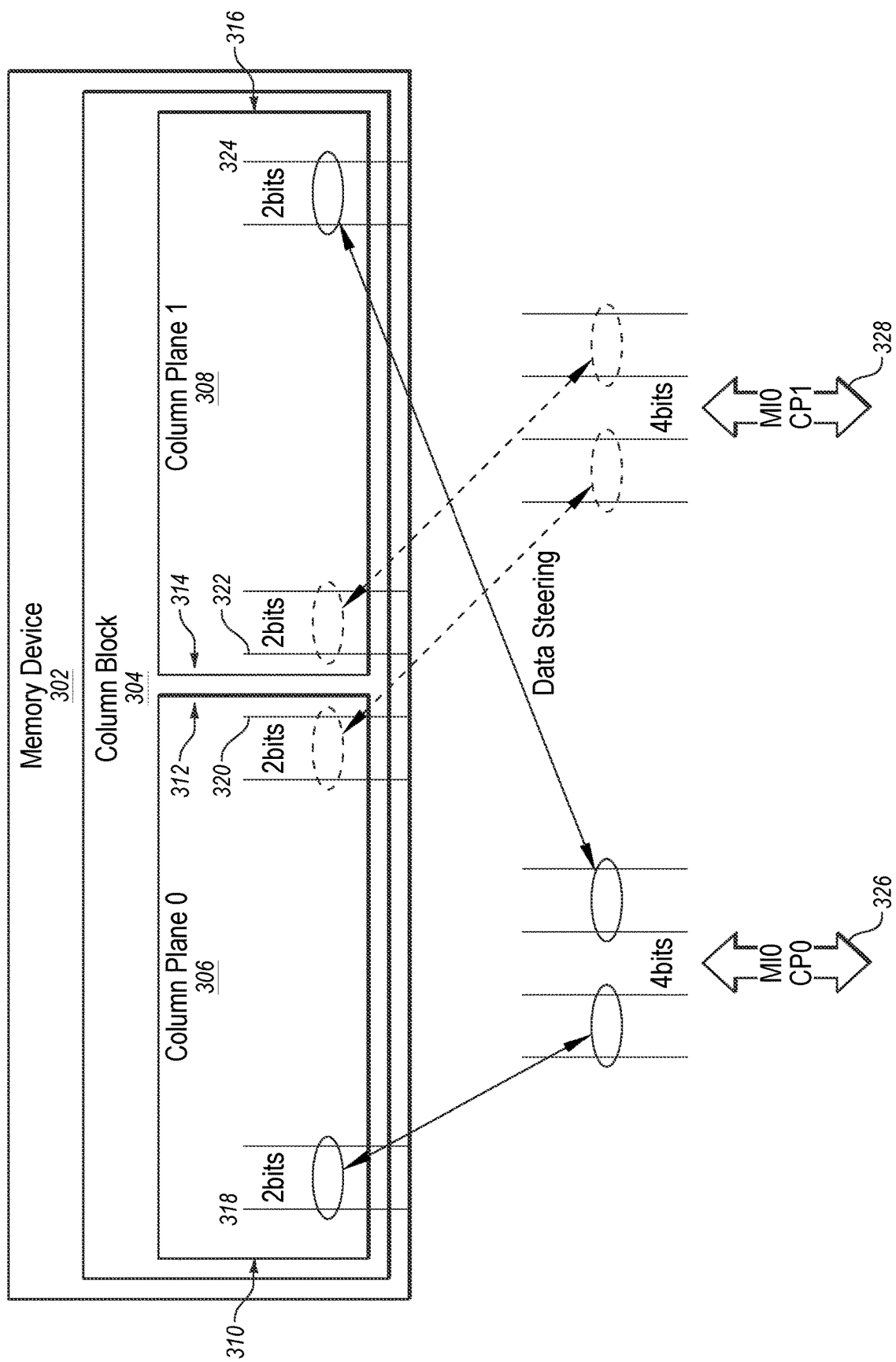
FIG. 3 is a functional block diagram illustrating additional functional aspects of an example memory device in accordance with at least one embodiment of the present disclosure.

FIG. 3 is a functional block diagram illustrating additional functional aspects of an example memory device 302 in accordance with at least one embodiment of the present disclosure. In particular, FIG. 3 illustrates an example set of logical relations between digit lines and input/output lines. Memory device 302 may be an example of memory device 100 and may include all of the elements of memory device 100, though, for simplicity, many of the elements of memory device 100 are not illustrated in FIG. 3.

FIG. 3 illustrates memory device 302 including a column block 304 comprised of a first column plane, column plane 0 306 and a second column plane, column plane 1 308. A digit line 318 (proximate to an edge 310) and a digit line 320 (proximate to an edge 312) may extend above column plane 0 306 and a digit line 322 (proximate to an edge 314) and a digit line 324 (proximate to an edge 316) may extend above column plane 1 308.

Column block 304 may be the same as, or substantially similar to column block 204 as described above with regard to FIG. 2. Column plane 0 306 and column plane 1 308 may be the same as, or substantially similar to, column plane 0 210 and column plane 1 212 as described above with regard to FIG. 2.

According to the example set of logical relations of FIG. 3, digit line 318 may be logically related (e.g., by a data-steering circuit, e.g., data steerer 176 of FIG. 1) to column plane 0 306 e.g., by being selectively electrically coupled to input/output lines associated with column plane 0 306, e.g., MIO CP0 326. MIO CP0 326 may be a representation of input/output lines associated with column plane 0 306.

Additionally, according to the example set of logical relations of FIG. 3, digit line 320 may be logically related (e.g., by the data-steering circuit) to column plane 1 308 e.g., by being selectively electrically coupled to input/output lines associated with column plane 1 308, e.g., MIO CP1 328. MIO CP1 328 may be a representation of input/output lines associated with column plane 1 308. Thus, digit line 320 may be logically related to column plane 1 308 even though digit line 320 is above column plane 0 306.

Additionally, according to the example set of logical relations of FIG. 3, digit line 322 may be logically related (e.g., by the data-steering circuit) to column plane 1 308 e.g., by being selectively electrically coupled to input/output lines associated with column plane 1 308, e.g., MIO CP1 328.

Additionally, according to the example set of logical relations of FIG. 3, digit line 324 may be logically related (e.g., by the data-steering circuit) to column plane 0 306 e.g., by being selectively electrically coupled to input/output lines associated with column plane 0 306, e.g., MIO CP0 326. Thus, digit line 324 may be logically related to column plane 0 306 even though digit line 324 is above column plane 1 308.

One result of the logical relationship between digit line 320 and digit line 322 and column plane 1 308 is that a failure at digit line 320 and digit line 322 may be treated as a one-column-plane failure rather than as a two-column-plane failure. Likewise, because of the logical relationship between digit line 318 and digit line 324 and column plane 0 306, a failure at digit line 318 and digit line 324 may be treated as a one-column-plane failure rather than as a two-column-plane failure.

The logical relationship between digit line 318 and digit line 324 and column plane 0 306 is given as an example. In other embodiments, digit line 318 and digit line 324 could be logically related to column plane 1 308. Likewise, the logical relationship between digit line 320 and digit line 322 and column plane 1 308 is given as an example. In other embodiments, digit line 320 and digit line 322 could be logically related to column plane 0 306.

In the examples provided in this disclosure, only one digit line per edge is described. However, the logical relations and selective electrical couplings described herein may be applied to any number of digit lines. For example, two digit lines at each edge may be logically related with other digit lines, with column-select signals, with input/output lines, and/or with column planes. For example, a digit line adjacent to digit line 318 (illustrated, but not numbered) may be selectively electrically coupled to MIO CP0 326, a digit line adjacent to digit line 320 (illustrated, but not numbered) on column plane 0 306 may be selectively electrically coupled to MIO CP1 328, a digit line adjacent to digit line 322 (illustrated, but not numbered) on column plane 1 308 may be selectively electrically coupled to MIO CP1 328, and a digit line adjacent to digit line 324 (illustrated, but not numbered) may be selectively electrically coupled to MIO CP0 326.

Figure 4A:
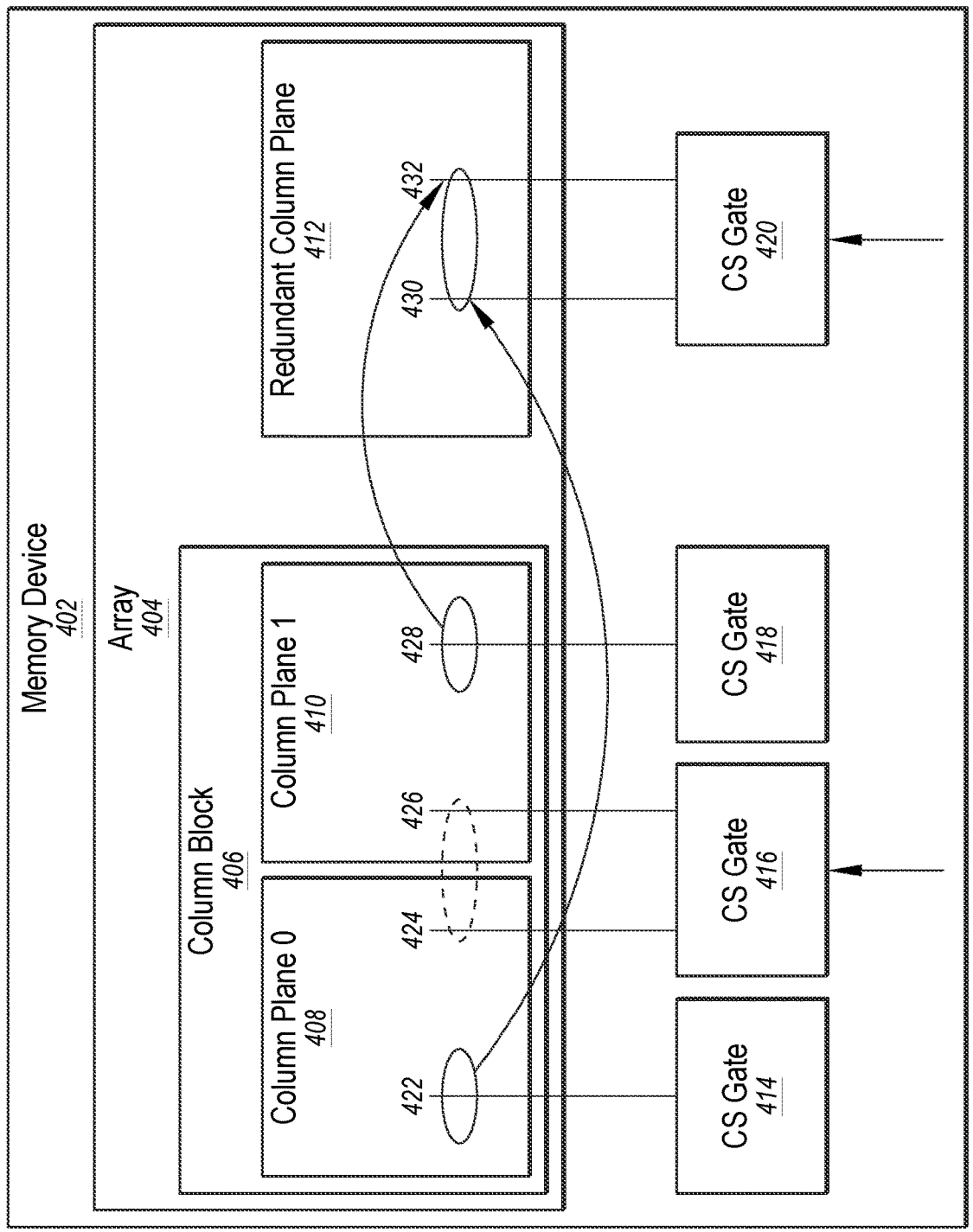
FIG. 4B is another functional block diagram illustrating additional functional aspects of an example memory device in accordance with at least one embodiment of the present disclosure.
Figure 4B:
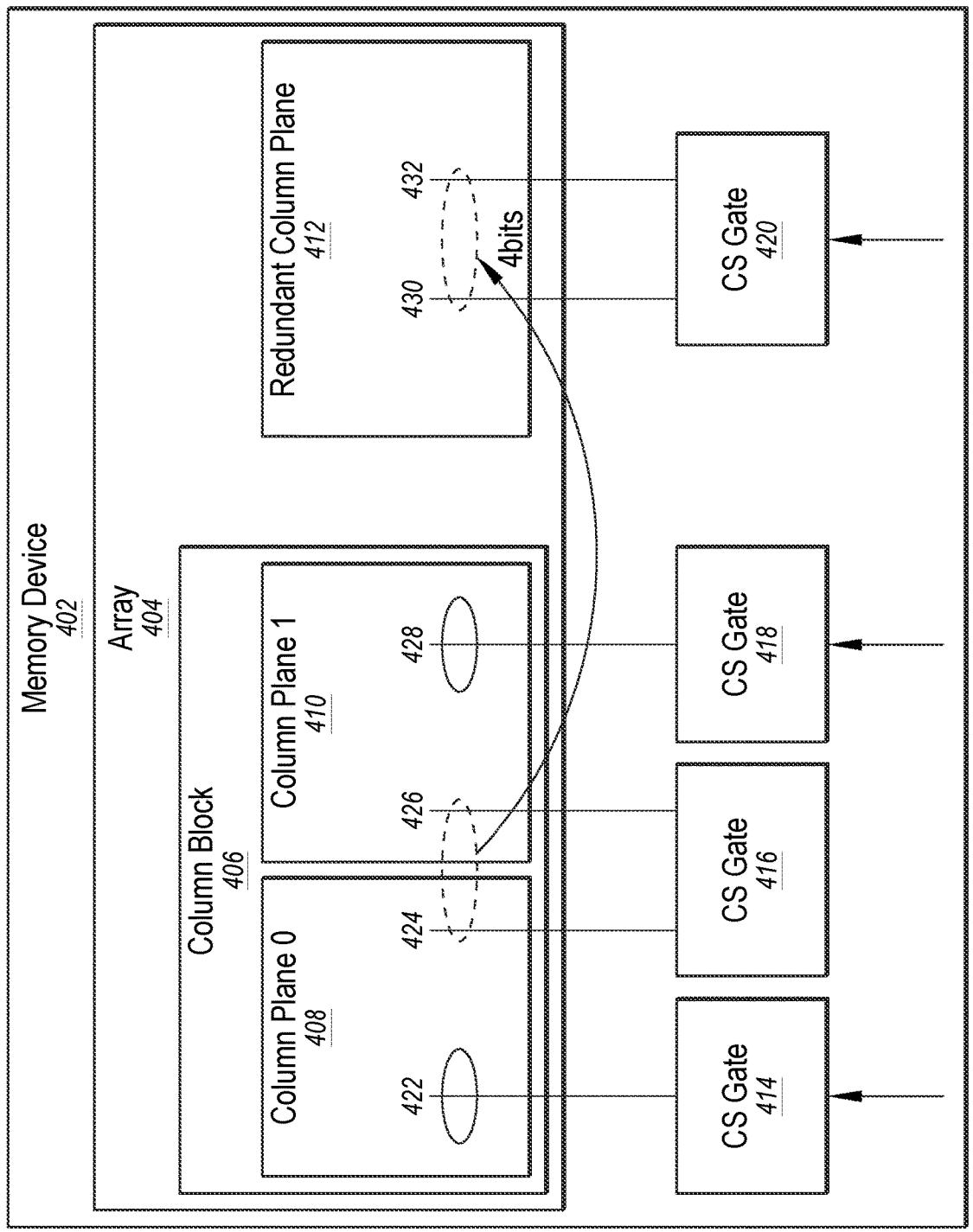

Each of FIG. 4A and FIG. 4B is a functional block diagram illustrating additional functional aspects of an example memory device 402 in accordance with at least one embodiment of the present disclosure. In particular, each of FIG. 4A and FIG. 4B illustrates example repair operations. Memory device 402 may be an example of memory device 100 and may include all of the elements of memory device 100, though, for simplicity, many of the elements of memory device 100 are not illustrated in FIG. 4A and FIG. 4B.

Memory device 402 includes an array 404 including a column block 406. Array 404 may include more than one column block, but, for simplicity, only column block 406 is illustrated. Additionally, array 404 includes a redundant column plane 412. Column block 406 includes a first column plane, column plane 0 408 and a second column plane, column plane 1 410. Column plane 0 408 may include a digit line 422 and a digit line 424, column plane 1 410 may include a digit line 426 and a digit line 428, and redundant column plane 412 may include a digit line 430 and a digit line 432. Memory device 402 includes a CS gate 414, a CS gate 416, a CS gate 418, and a CS gate 420 (which may be referred to collectively as CS gates or individually as CS gate).

Column block 406 may be the same as, or substantially similar to column block 204 as described above with regard to FIG. 2. Column plane 0 408 and column plane 1 410 may be the same as or substantially similar to column plane 0 210 and column plane 1 212 as described above with regard to FIG. 2. Each of CS gate 414, CS gate 416, CS gate 418, and CS gate 420 may be the same as, or substantially similar to, any of the CS gates described above with regard to FIG. 2.

Redundant column plane 412 may be the same as, or substantially similar to column plane 0 210 as described with regard to FIG. 2. Array 404 may include one or more redundant column planes such that digit lines (or memory cells associated therewith) of column planes (e.g., column plane 0 408 and column plane 1 410) may be replaced by digit lines (and memory cells associated therewith) in one of the one or more redundant column planes (e.g., redundant column plane 412). Such replacements may be directed by a data-steering circuit (e.g., data steerer 176 of FIG. 1) or by some other circuit or module, e.g., a repair circuit or module (not illustrated).

For example, if a failure is detected at a digit line 422, the data-steering circuit may be configured to electrically couple input/output lines that would otherwise be electrically coupled to digit line 422 to digit line 430 e.g., as illustrated in FIG. 4A. For example, the data-steering circuit may be configured to send a control signal to CS gate 420 to access digit line 430 and digit line 432 instead of sending a control signal to CS gate 414 and CS gate 418 to access digit line 422 and digit line 428 respectively. Further, the data-steering circuit may electrically couple digit line 430 and digit line 432 to input/output lines instead of coupling digit line 422 and digit line 428 to input/output lines. As another example, as illustrated in FIG. 4B, the data-steering circuit may be configured to send a control signal to CS gate 420 to access digit line 430 and digit line 432 instead of sending a control signal to CS gate 416 to access digit line 424 and digit line 426 respectively. Further, the data-steering circuit may electrically couple digit line 430 and digit line 432 to input/output lines instead of coupling digit line 424 and digit line 426 to input/output lines. Electrically coupling an input/output line to a digit line of redundant column plane 412 rather than to a digit line in column plane 0 408 or column plane 1 410, in which a failure has been detected, may be an example of a repair operation.

One aspect of embodiments of the present disclosure, in relation to repair operations, is that, based on the logical relationships between digit lines, digit lines from separate column planes may be repaired by related digit lines in a redundant column plane. As a specific example, in a case where digit line 424 is associated with digit line 426, a repair of both digit line 424 and digit line 426 may be implemented at digit line 430 and digit line 432 of redundant column plane 412 e.g., as illustrated in FIG. 4B. Digit line 430 and digit line 432 may be related, e.g., both digit line 430 and digit line 432 may be on redundant column plane 412 and/or may be accessible by CS gate 420. As another specific example, digit line 422 may be logically related to digit line 428 and thus, both may be repaired by digit line 430 and digit line 432 respectively e.g., as illustrated in FIG. 4A.

In some memory devices, there may be a limited number of redundant column planes per array, or a limited number of fuses to indicate relationships between column planes and redundant column planes. Embodiments of the present disclosure can, through the logical relations described herein, allow digit lines (including edge digit lines) from separate column planes to be repaired by a single redundant column plane. This may enable an array (e.g., array 404) of many column planes to include more repairs than would be possible without the logical relations described herein.

Figure 5:
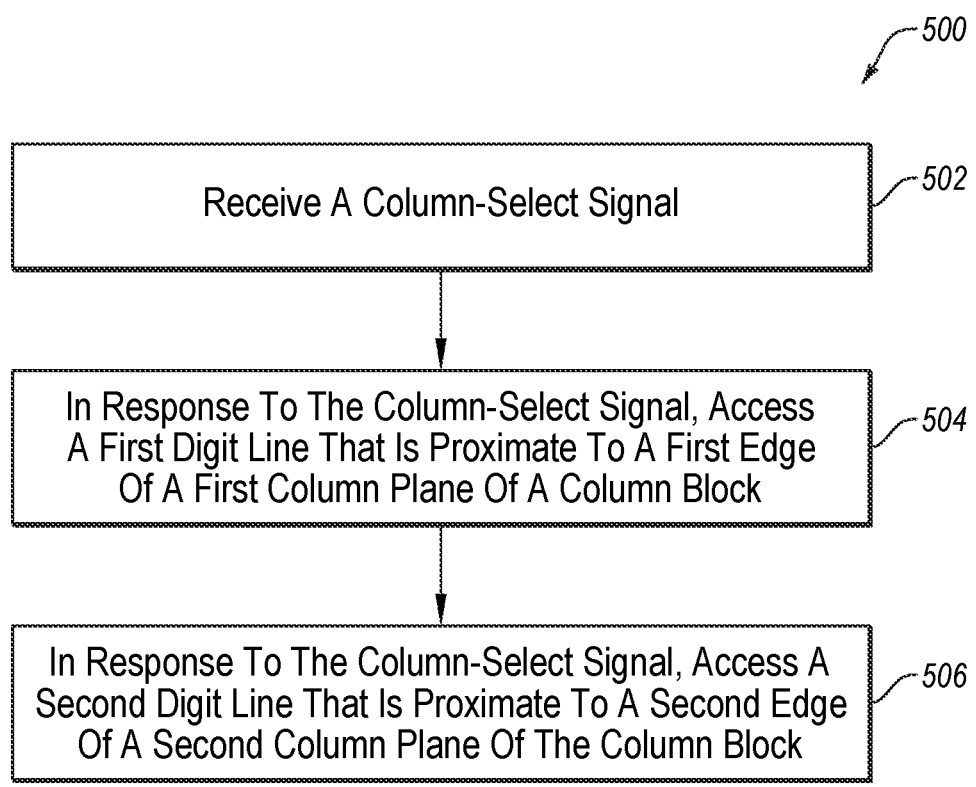
FIG. 5 is a flowchart illustrating an example method in accordance with at least one embodiment of the present disclosure.

FIG. 5 is a flowchart illustrating an example method 500 in accordance with at least one embodiment of the present disclosure. Method 500 may be performed by or at a memory device e.g., memory device 100 of FIG. 1, memory device 202 of FIG. 2, memory device 302 of FIG. 3, or memory device 402 of FIG. 4A and FIG. 4B, memory system 700 of FIG. 7, electronic system 800 of FIG. 8, or another device or system. Although illustrated as discrete blocks, various blocks may be divided into additional blocks, combined into fewer blocks, or eliminated, depending on the desired implementation.

At block 502, a column-select signal may be received. The column-select signal may be or include an instruction to access one or more digit lines. For example, the column-select signal may be or include an instruction to electrically couple one or more digit lines to one or more input/output lines.

At block 504, in response to the column-select signal, a first digit line may be accessed. The first digit line may be proximate to a first edge of a first column plane of a column block. Access may include an electrical coupling between the first digit line and a first input/output line.

At block 506, in response to the column-select signal, a second digit line may be accessed. The second digit line may be proximate to a second edge of a second column plane of the column block. Access may include an electrical coupling between the second digit line and a second input/output line.

In a first example of method 500, digit line 318 of FIG. 3, which is proximate to edge 310 of column plane 0 306 of FIG. 3, may be the first digit line of block 504; and digit line 324 of FIG. 3, which is proximate to edge 316 of column plane 1 308 of FIG. 3, may be the second digit line of block 506. In the first example of method 500, in response to a column-select signal, digit line 318 may be electrically coupled to MIO CP0 326 and digit line 324 may be electrically coupled to MIO CP0 326.

In a second example of method 500, digit line 320 of FIG. 3, which is proximate to edge 312 of column plane 0 306, may be the first digit line of block 504; and digit line 322 of FIG. 3, which is proximate to edge 314 of column plane 1 308, may be the second digit line of block 506. In the second example of method 500, in response to a column-select signal, digit line 320 may be electrically coupled to MIO CP1 328 and digit line 322 may be electrically coupled to MIO CP1 328.

Modifications, additions, or omissions may be made to method 500 without departing from the scope of the present disclosure. Furthermore, the outlined operations and actions are only provided as examples, and some of the operations and actions may be optional, combined into fewer operations and actions, or expanded into additional operations and actions without detracting from the essence of the disclosed embodiment.

Figure 6:
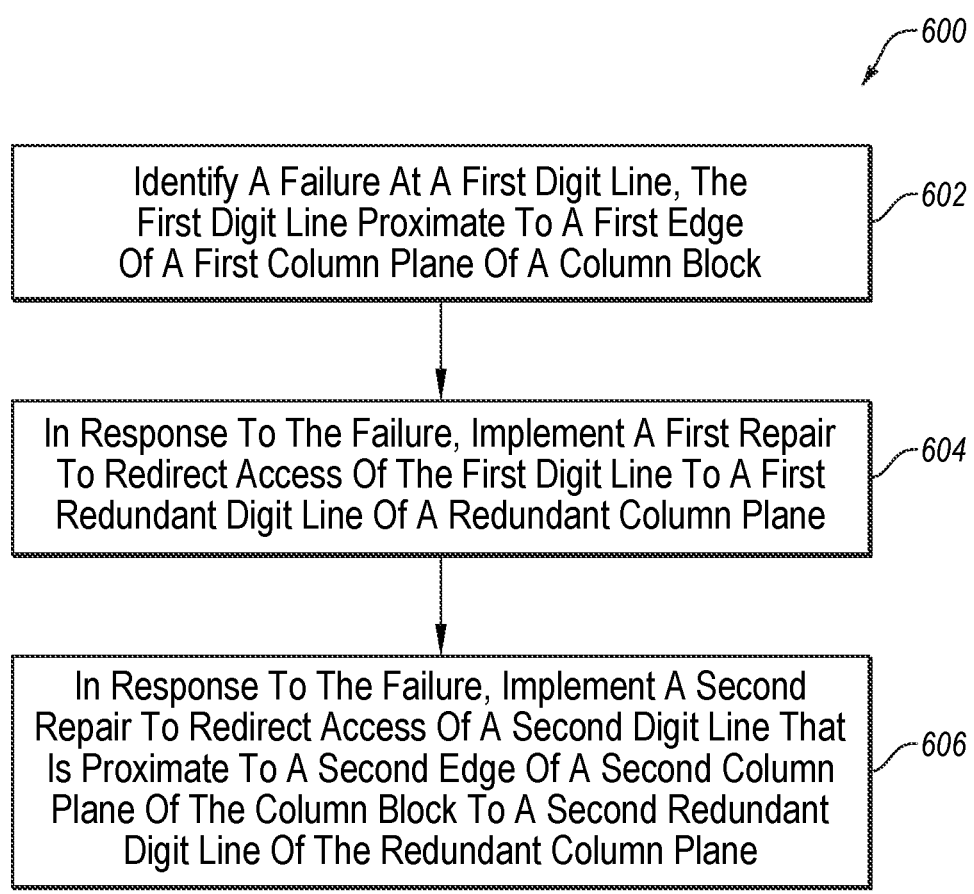
FIG. 6 is a flowchart illustrating another example method in accordance with at least one embodiment of the present disclosure.

FIG. 6 is a flowchart illustrating an example method 600 in accordance with at least one embodiment of the present disclosure. Method 600 may be performed by or at a memory device e.g., memory device 100 of FIG. 1, memory device 202 of FIG. 2, memory device 302 of FIG. 3, or memory device 402 of FIG. 4A and FIG. 4B, memory system 700 of FIG. 7, electronic system 800 of FIG. 8, or another device or system. Although illustrated as discrete blocks, various blocks may be divided into additional blocks, combined into fewer blocks, or eliminated, depending on the desired implementation.

At block 602, a failure may be identified at a first digit line. The first digit line may be proximate to a first edge of a first column plane of a first column block.

At block 604, in response to the failure, a first repair may be implemented. The first repair may be configured to redirect access of the first digit line to a first redundant digit line of a redundant column plane. Repairing may include redirecting access that would occur at the first digit line (e.g., to read from or write to the first digit line) to occur at the redundant digit line instead.

At block 606, in response to the failure, a second repair may be implemented. The second repair may be configured to redirect access of a second digit line to a second redundant digit line of the redundant column plane. The second digit line may be proximate to a second edge of a second column plane of the column block.

In a first example of method 600, digit line 422 of FIG. 4A, which is proximate to a first edge of column plane 0 408 of FIG. 4A, may be the first digit line of block 602 and block 604. Digit line 430 of FIG. 4A of redundant column plane 412 of FIG. 4A may be the first redundant digit line of block 604. Digit line 428 of FIG. 4A, which is proximate to a second edge of column plane 1 410 of FIG. 4A, may be the second digit line of block 606. And, digit line 432 of FIG. 4A of redundant column plane 412 may be the second redundant digit line of block 606. In the first example of method 600, digit line 422 is repaired by digit line 430 and digit line 428 is repaired by digit line 432 even though the failure was only detected at digit line 422. This is just an example, and in other cases, digit line 422 may be repaired by digit line 430 and digit line 428 may be repaired by digit line 432 in response to identification of a failure at digit line 428. Further, in some cases, digit line 422 may be repaired by digit line 430 and digit line 428 may be repaired by digit line 432 in response to identification of failures at both of digit line 422 and digit line 428.

In a second example of method 600, digit line 424 of FIG. 4B, which is proximate to a first edge of column plane 0 408 of FIG. 4B, may be the first digit line of block 602 and block 604. Digit line 430 of FIG. 4B of redundant column plane 412 of FIG. 4B may be the first redundant digit line of block 604. Digit line 426 of FIG. 4B, which is proximate to a second edge of column plane 1 410 of FIG. 4B, may be the second digit line of block 606. And, digit line 432 of FIG. 4B of redundant column plane 412 of FIG. 4B may be the second redundant digit line of block 606. In the second example of method 600, digit line 424 is repaired by digit line 430 and digit line 426 is repaired by digit line 432 even though the failure was only detected at digit line 424. This is just an example, and in other cases, digit line 424 may be repaired by digit line 430 and digit line 426 may be repaired by digit line 432 in response to identification of a failure at digit line 426. Further, in some cases, digit line 424 may be repaired by digit line 430 and digit line 426 may be repaired by digit line 432 in response to identification of failures at both of digit line 424 and digit line 426.

Modifications, additions, or omissions may be made to method 600 without departing from the scope of the present disclosure. Furthermore, the outlined operations and actions are only provided as examples, and some of the operations and actions may be optional, combined into fewer operations and actions, or expanded into additional operations and actions without detracting from the essence of the disclosed embodiment.

Figure 7:
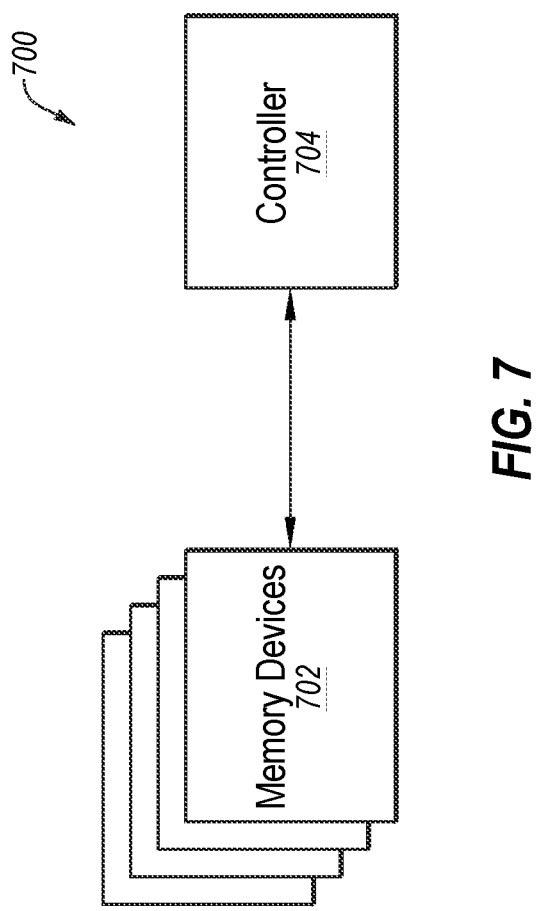
FIG. 7 is a simplified block diagram illustrating an example memory system, in accordance with at least one embodiment of the present disclosure.

FIG. 7 is a simplified block diagram illustrating an example memory system 700 implemented in accordance with at least one embodiment of the present disclosure. Memory system 700, which may include, for example, a semiconductor device, includes a number of memory devices 702 and a controller 704. Controller 704 may be operatively coupled with memory devices 702 so as to convey command/address signals (e.g., command/address signals received by command terminals 112 and/or address terminals 110 of FIG. 1) to memory devices 702.

One or more of memory devices 702 may include memory device 100 of FIG. 1 and may include all of the elements described with relation to memory device 100. Further, memory devices 702 may perform any or all of the operations described with regard to memory device 202, memory device 302, and/or memory device 402. As a specific example, memory devices 702 may be configured to logically relate one or more of its digit lines together and/or with column-select signals and/or with input/output lines.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 8 is a simplified block diagram illustrating an electronic system 800 implemented in accordance with at least one embodiment of the present disclosure. Electronic system 800 includes at least one input device 802, which may include, for example, a keyboard, a mouse, or a touch screen. Electronic system 800 further includes at least one output device 804, such as a monitor, a touch screen, or a speaker. Input device 802 and output device 804 are not necessarily separable from one another. Electronic system 800 further includes a storage device 806. Input device 802, output device 804, and storage device 806 may be coupled to a processor 808. Electronic system 800 further includes a memory device 810 coupled to processor 808. Memory device 810 may include at least a portion of memory system 700 of FIG. 7. Electronic system 800 may include, for example, a computing, processing, industrial, or consumer product. For example, without limitation, electronic system 800 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

One or more embodiments may include a memory device. The memory device may include a first column plane, a second column plane, and a data-steering circuit. The first column plane may include a first edge, a second edge opposite the first edge, and a first number of digit lines arranged between the first edge and the second edge. The first number of digit lines may be configured to access a number of memory cells of the first column plane. The second column plane may be positioned adjacent to the first column plane. The second column plane may include a third edge positioned adjacent to the second edge of the first column plane, a fourth edge opposite the third edge; and a second number of digit lines arranged between the third edge and the fourth edge. The data-steering circuit may be configured to logically relate a first digit line of the first number of digit lines to a second digit line of the second number of digit lines. The first digit line may be proximate to the first edge and the second digit line may be proximate to the fourth edge.

In these or other embodiments, the data-steering circuit may be further configured to logically relate a third digit line of the first number of digit lines to a fourth digit line of the second number of digit lines. The third digit line may be proximate to the second edge and the fourth digit line may be proximate to the third edge.

One or more embodiments may include a memory device. The memory device may include a first column plane, a second column plane, and a data-steering circuit. The first column plane may include a first edge, a second edge opposite the first edge, and a first number of digit lines arranged between the first edge and the second edge. The first number of digit lines may be configured to access a number of memory cells of the first column plane. The second column plane may be positioned adjacent to the first column plane. The second column plane may include a third edge positioned adjacent to the second edge of the first column plane, a fourth edge opposite the third edge; and a second number of digit lines arranged between the third edge and the fourth edge. The data-steering circuit may be configured to logically relate a first digit line of the first number of digit lines to a second digit line of the second number of digit lines. The first digit line may be proximate to the second edge and the second digit line may be proximate to the third edge.

In these or other embodiments, the data-steering circuit may be further configured to logically relate a third digit line of the first number of digit lines to a fourth digit line of the second number of digit lines. The third digit line may be proximate to the first edge and the fourth digit line may be proximate to the fourth edge.

One or more embodiments may include a memory device. The memory device may include a first column plane, a second column plane and a data-steering circuit. The first column plane may include a first edge, a second edge opposite the first edge, and a first number of digit lines arranged between the first edge and the second edge. The first number of digit lines may be configured to access a number of memory cells of the first column plane. The first number of digit lines may include a first digit line proximate to the second edge. The second column plane may be positioned adjacent to the first column plane. The second column plane may include a third edge positioned adjacent to the second edge of the first column plane, a fourth edge opposite the third edge, and a second number of digit lines arranged between the third edge and the fourth edge. The second number of digit lines may include a second digit line proximate to the third edge. The data-steering circuit may be configured to logically relate the first digit line to the second digit line.

In these or other embodiments, the data-steering circuit may be further configured to logically relate a third digit line of the first number of digit lines to a fourth digit line of the second number of digit lines. The third digit line may be proximate to the first edge and the fourth digit line may be proximate to the fourth edge.

One or more embodiments may include a memory device. The memory device may include a first column plane, a second column plane and a data-steering circuit. The first column plane may include a first edge, a second edge opposite the first edge, and a first number of digit lines arranged between the first edge and the second edge. The first number of digit lines may be configured to access a number of memory cells of the first column plane. The first number of digit lines may include a first digit line proximate to the first edge. The second column plane may be positioned adjacent to the first column plane. The second column plane may include a third edge positioned adjacent to the second edge of the first column plane, a fourth edge opposite the third edge, and a second number of digit lines arranged between the third edge and the fourth edge. The second number of digit lines may include a second digit line proximate to the fourth edge. The data-steering circuit may be configured to logically relate the first digit line to the second digit line.

In these or other embodiments, the data-steering circuit may be further configured to logically relate a third digit line of the first number of digit lines to a fourth digit line of the second number of digit lines. The third digit line may be proximate to the second edge and the fourth digit line may be proximate to the third edge.

One or more embodiments may include a system, the system may include at least one input device, at least one output device, at least one processor device, and at least one memory device. The at least one processor device may be operably coupled to the input device and the output device. The at least one memory device may be operably coupled to the at least one processor device. The at least one memory device may include at least one column block and a data-steering circuit. Each of the at least one column block may include a first column plane and a second column plane. The first column plane may include a first edge, a second edge opposite the first edge, a first digit line proximate to the first edge, and a second digit line proximate to the second edge. The second column plane may be positioned adjacent to the first column plane. The second column plane may include a third edge positioned adjacent to the second edge of the first column plane, a fourth edge, opposite the third edge, a third digit line proximate to the third edge, and a fourth digit line proximate to the fourth edge. The data-steering circuit may be configured to logically relate the first digit line to the fourth digit line and the second digit line to the third digit line.

One or more embodiments may include a system, the system may include at least one input device, at least one output device, at least one processor device, and at least one memory device. The at least one processor device may be operably coupled to the input device and the output device. The at least one memory device may be operably coupled to the at least one processor device. The at least one memory device may include at least one column block and a data-steering circuit. Each of the at least one column block may include a first column plane and a second column plane. The first column plane may include a first edge, a second edge opposite the first edge, a first digit line proximate to the first edge, and a second digit line proximate to the second edge. The second column plane may be positioned adjacent to the first column plane. The second column plane may include a third edge positioned adjacent to the second edge of the first column plane, a fourth edge, opposite the third edge, a third digit line proximate to the third edge, and a fourth digit line proximate to the fourth edge. The data-steering circuit may be configured to logically relate the first digit line to the fourth digit line.

One or more embodiments may include a system, the system may include at least one input device, at least one output device, at least one processor device, and at least one memory device. The at least one processor device may be operably coupled to the input device and the output device. The at least one memory device may be operably coupled to the at least one processor device. The at least one memory device may include at least one column block and a data-steering circuit. Each of the at least one column block may include a first column plane and a second column plane. The first column plane may include a first edge, a second edge opposite the first edge, a first digit line proximate to the first edge, and a second digit line proximate to the second edge. The second column plane may be positioned adjacent to the first column plane. The second column plane may include a third edge positioned adjacent to the second edge of the first column plane, a fourth edge, opposite the third edge, a third digit line proximate to the third edge, and a fourth digit line proximate to the fourth edge. The data-steering circuit may be configured to logically relate the second digit line to the third digit line.

One or more embodiments may include a method. The method may include receiving a column-select signal. The method may also include, in response to the column-select signal, accessing a first digit line that is proximate to a first edge of a first column plane of a column block. The method may also include, in response to the column-select signal, accessing a second digit line that is proximate to a second edge of a second column plane of the column block.

In these or other embodiments, the first column plane may include a third edge opposite the first edge and the second column plane may include a fourth edge opposite the second edge. Further, the first column plane may be proximate to the second column plane such that the third edge is adjacent to the fourth edge.

In these or other embodiments, the first column plane may be proximate to the second column plane and the first edge of the first column plane may be adjacent to the second edge of the second column plane.

One or more embodiments may include a method. The method may include identifying a failure at a first digit line. The first digit line may be proximate to a first edge of a first column plane of a column block. The method may also include, in response to the failure, implementing a first repair to redirect access of the first digit line to a first redundant digit line of a redundant column plane. The method may also include, in response to the failure, implementing a second repair to redirect access of a second digit line that is proximate to a second edge of a second column plane of the column block to a second redundant digit line of the redundant column plane.

In these or other embodiments, the first column plane may include a third edge opposite the first edge and the second column plane may include a fourth edge opposite the second edge. Further, the first column plane may be proximate to the second column plane such that the third edge is adjacent to the fourth edge.

In these or other embodiments, the first column plane may be proximate to the second column plane and the first edge of the first column plane may be adjacent to the second edge of the second column plane.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device comprising:
   a first column plane comprising:
      a first edge;
      a second edge opposite the first edge; and
      a first number of digit lines arranged between the first edge and the second edge, the first number of digit lines configured to access a number of memory cells of the first column plane;
   a second column plane positioned adjacent to the first column plane, the second column plane comprising:
      a third edge positioned adjacent to the second edge of the first column plane;
      a fourth edge opposite the third edge; and
      a second number of digit lines arranged between the third edge and the fourth edge; and
   a data-steering circuit configured to:
      logically relate a first digit line of the first number of digit lines to a second digit line of the second number of digit lines, the first digit line proximate to the first edge, the second digit line proximate to the fourth edge; and
      logically relate the first digit line and the second digit line to the first column plane such that a repair implemented for either or both of the first digit line and the second digit line is attributed to the first column plane.

2. The memory device of claim 1, wherein the data-steering circuit is further configured to, in response to a column-select signal, electrically couple:
   the first digit line to a first input/output (I/O) line; and
   the second digit line to a second I/O line.

3. The memory device of claim 2, wherein the data-steering circuit is further configured to, in response to a failure at either or both of the first digit line and the second digit line, and further in response to the column-select signal, electrically couple:
   a third digit line to the first I/O line, the third digit line in a redundant column plane; and
   a fourth digit line to the second I/O line, the fourth digit line in the redundant column plane.

4. The memory device of claim 1, wherein the data-steering circuit is further configured to logically relate a third digit line of the first number of digit lines to a fourth digit line of the second number of digit lines, the third digit line proximate to the second edge, the fourth digit line proximate to the third edge.

5. The memory device of claim 4, wherein data-steering circuit is further configured to, in response to a column-select signal, electrically couple:
   the first digit line to a first input/output (I/O) line;
   the second digit line to a second I/O line;
   the third digit line to a third I/O line; and
   the fourth digit line to a fourth I/O line.

6. The memory device of claim 5, wherein the data-steering circuit is further configured to, in response to a failure at either or both of the third digit line and the fourth digit line, and further in response to the column-select signal, electrically couple:
   a fifth digit line to the third I/O line, the fifth digit line in a redundant column plane; and
   a sixth digit line to the fourth I/O line, the sixth digit line in the redundant column plane.

7. The memory device of claim 4, wherein the data-steering circuit is further configured to logically relate the first digit line and the second digit line to the first column plane and to logically relate the third digit line and the fourth digit line to the second column plane such that a repair implemented for either or both of the first digit line and the second digit line is attributed to the first column plane and a repair implemented for either or both of the third digit line and the fourth digit line is attributed to the second column plane.

8. A memory device comprising:
   a first column plane comprising:
      a first edge;
      a second edge opposite the first edge; and
      a first number of digit lines arranged between the first edge and the second edge, the first number of digit lines configured to access a number of memory cells of the first column plane, the first number of digit lines including a first digit line proximate to the second edge;
   a second column plane positioned adjacent to the first column plane, the second column plane comprising:
      a third edge positioned adjacent to the second edge of the first column plane;
      a fourth edge opposite the third edge; and
      a second number of digit lines arranged between the third edge and the fourth edge, the second number of digit lines including a second digit line proximate to the third edge; and
   a data-steering circuit configured to:
      logically relate the first digit line to the second digit line; and
      in response to a column-select signal, electrically couple:
         the first digit line to a first input/output (I/O) line; and
         the second digit line to a second I/O line.

9. The memory device of claim 8, wherein the data-steering circuit is further configured to, in response to a failure at either or both of the first digit line and the second digit line, and further in response to the column-select signal, electrically couple:
   a third digit line to the first I/O line, the third digit line in a redundant column plane; and
   a fourth digit line to the second I/O line, the fourth digit line in the redundant column plane.

10. The memory device of claim 8, wherein the data-steering circuit is further configured to logically relate the first digit line and the second digit line to the second column plane such that a repair implemented for either or both of the first digit line and the second digit line is attributed to the second column plane.

11. The memory device of claim 8, wherein the data-steering circuit is further configured to logically relate a third digit line of the first number of digit lines to a fourth digit line of the second number of digit lines, the third digit line proximate to the first edge, the fourth digit line proximate to the fourth edge.

12. The memory device of claim 11, wherein data-steering circuit is further configured to, in response to a column-select signal, electrically couple:
   the first digit line to a first input/output (I/O) line;
   the second digit line to a second I/O line;
   the third digit line to a third I/O line; and
   the fourth digit line to a fourth I/O line.

13. The memory device of claim 12, wherein the data-steering circuit is further configured to, in response to a failure at either or both of the third digit line and the fourth digit line, and further in response to the column-select signal, electrically couple:

a fifth digit line to the third I/O line, the fifth digit line in a redundant column plane; and a sixth digit line to the fourth I/O line, the sixth digit line in the redundant column plane.

14. The memory device of claim 11, wherein the data-steering circuit is further configured to logically relate the first digit line and the second digit line to the second column plane and to logically relate the third digit line and the fourth digit line to the first column plane such that a repair implemented for either or both of the first digit line and the second digit line is attributed to the second column plane and a repair implemented for either or both of the third digit line and the fourth digit line is attributed to the first column plane.

15. A system, comprising:
at least one input device;
at least one output device;
at least one processor device operably coupled to the input device and the output device; and
at least one memory device operably coupled to the at least one processor device, the at least one memory device comprising:
at least one column block, each of the at least one column blocks comprising:
a first column plane comprising:
a first edge;
a second edge opposite the first edge;
a first digit line proximate to the first edge; and
a second digit line proximate to the second edge; and
a second column plane positioned adjacent to the first column plane, the second column plane comprising:
a third edge positioned adjacent to the second edge of the first column plane;
a fourth edge, opposite the third edge;
a third digit line proximate to the third edge; and
a fourth digit line proximate to the fourth edge; and a data-steering circuit configured to:
logically relate the first digit line to the fourth digit line;
logically relate the second digit line to the third digit line;
in response to a failure at either or both of the first digit line and the fourth digit line, and further in response to a column-select signal, electrically couple:
a fifth digit line to a first input/output (I/O) line, the fifth digit line in a redundant column plane; and
a sixth digit line to a fourth I/O line, the sixth digit line in the redundant column plane; and
in response to a failure at either or both of the second digit line and the third digit line, and further in response to the column-select signal, electrically couple:
a seventh digit line to a second I/O line, the seventh digit line in the redundant column plane; and
an eighth digit line to a third I/O line, the eighth digit line in the redundant column plane.

16. The system of claim 15, wherein data-steering circuit is further configured to, in response to a column-select signal, electrically couple:
the first digit line to the first I/O line;
the second digit line to the second I/O line;
the third digit line to the third I/O line; and
the fourth digit line to the fourth I/O line.

17. The system of claim 15, wherein the data-steering circuit is further configured to logically relate the first digit line and the fourth digit line to the first column plane and to logically relate the second digit line and the third digit line to the second column plane such that a repair implemented for either or both of the first digit line and the fourth digit line is attributed to the first column plane and a repair implemented for either or both of the second digit line and the third digit line is attributed to the second column plane.

\* \* \* \* \*

UNITED STATES PATENT AND TRADEMARK OFFICE
CERTIFICATE OF CORRECTION

PATENT NO. : 11,514,977 B2
APPLICATION NO. : 17/220110
DATED : November 29, 2022
INVENTOR(S) : Yuan He and Jongtae Kwak It is certified that error appears in the above-identified patent and that said Letters Patent is hereby corrected as shown below:

In the Specification
Column 3, Line 15, change "input/output (TO)" to --input/output (IO)--
Column 5, Line 27, change "and/CK may" to --and /CK may--
Column 5, Line 30, change "and/CK may" to --and /CK may--

Signed and Sealed this
Twentieth Day of June, 2023

Katherine Kelly Vidal
*Director of the United States Patent and Trademark Office*